United States Patent [19]

Kurita

[11] Patent Number: 5,313,651
[45] Date of Patent: May 17, 1994

[54] SATELLITE BROADCAST RECEIVER

[75] Inventor: Tadashi Kurita, Kanagawa, Japan

[73] Assignee: Sony Corporation, Tokyo, Japan

[21] Appl. No.: 739,238

[22] Filed: Aug. 1, 1991

[30] Foreign Application Priority Data

Aug. 17, 1990 [JP] Japan .................. 2-215742

[51] Int. Cl.$^5$ ............................................. H04B 17/02
[52] U.S. Cl. ...................... 455/3.2; 455/148; 455/154.2; 455/155.1; 455/184.1; 455/226.3; 348/729; 348/731
[58] Field of Search ............ 455/3.2, 179.1, 186.1, 455/188.1, 234.1, 234.2, 296, 226.3, 295, 154.2, 155.1, 157.2, 158.1, 158.2, 158.3, 158.4, 158.5, 159.1, 159.2, 145–148, 184.1; 358/188, 192.1

[56] References Cited

U.S. PATENT DOCUMENTS

| | | | |
|---|---|---|---|
| 4,032,716 | 6/1977 | Allen | 370/17 |
| 4,214,273 | 7/1980 | Brown | 358/192.1 |
| 4,650,968 | 8/1986 | Hayashi | 358/192.1 |
| 4,761,825 | 8/1988 | Ma | 455/186.1 |
| 4,935,814 | 6/1990 | Omoto et al. | 358/192.1 |
| 5,089,885 | 2/1992 | Clark | 455/2 |
| 5,103,313 | 4/1992 | Chan et al. | 358/192.1 |
| 5,134,707 | 7/1992 | Sakashita et al. | 455/3.2 |

FOREIGN PATENT DOCUMENTS

| | | |
|---|---|---|
| 0181701 | 5/1986 | European Pat. Off. . |
| 0368581 | 5/1990 | European Pat. Off. . |
| 2523739 | 12/1975 | Fed. Rep. of Germany . |
| 2439141 | 2/1976 | Fed. Rep. of Germany . |
| 0163537 | 8/1985 | Japan .................. 455/154.2 |

Primary Examiner—Reinhard J. Eisenzopf
Assistant Examiner—Andrew Faile
Attorney, Agent, or Firm—Lewis H. Eslinger; Jay H. Maioli

[57] ABSTRACT

A receiver apparatus detects a received level from an AGC voltage relative to a received signal. For measuring the received level (a level outputted from an antenna), noise levels at predetermined frequencies higher and lower than the broadcast frequency band and a received signal level upon receiving a broadcast at an arbitrary channel are measured, and a received level corresponding to C/N at the received channel is calculated from the three measured values, thereby eliminating received level calculation differences among channels occurring when the received level is calculated on the basis of the AGC voltage.

5 Claims, 3 Drawing Sheets

SATELLITE BROADCAST RECEIVER

BACKGROUND OF THE INVENTION

1. Field of the Invention

This invention relates to a receiver apparatus suitable for receiving, for example, a satellite broadcast and so on.

2. Description of the Prior Art

There has been known a satellite broadcast tuner (hereinafter referred to as "the BS tuner") which, for example, utilizes an AGC voltage of a tuner unit to calculate a received level and display the calculated received level on the screen of a television receiver connected thereto (or integrated therewith).

Since especially the BS tuner requires that a BS antenna be strictly set in an appropriate direction for receiving satisfactory images, it is quite useful to display a received level on the screen of a television receiver as a guide for determining an optimal setting direction of the antenna.

The received level calculated by the BS tuner is not a simple BS-IF level of a received channel but a value, for example, corresponding to a received C/N which is calculated by simultaneously measuring a received noise level at a predetermined frequency. This example will be described with reference to FIG. 1.

In that case, an IF level (carrier level) is calculated from an AGC voltage at an arbitrary channel (for example, BS channel 11) and a received level or a noise level at a frequency out of the received frequency band of the satellite broadcast channels (1st–15th channels), for example, a frequency corresponding to a channel 16.5 is similarly measured from the AGC voltage. The received level $L_{CN}$ is calculated, for example, by the following equation:

$$L_{CN} = K \times \frac{C_{f(x)}}{N_{f(16.5)}}$$

where K represents a correction coefficient, $C_{f(x)}$ a received level (carrier level) measured when it is received at a frequency of a channel x, and $N_{f(16.5)}$ a received level (noise level) measured when it is received at a frequency corresponding to the channel 16.5.

Measured values of the AGC voltages at the respective channels in a certain receiving condition present higher values as the channels are in a higher frequency region, for example, as indicated by solid lines illustrated in FIG. 1. This phenomenon is caused by the frequency characteristics of a BS converter, a BS cable, a bandpass filter used in a tuner unit, the AGC voltage and so on.

However, since the received levels of the respective channels derived by the prior art are calculated on the basis of a noise level (indicated by one-dot chain lines in FIG. 1) measured at a frequency outside the received frequency band, for example, at a frequency corresponding to the channel 16.5, the received levels of the respective channels are calculated as values corresponding to l (l1–l15) indicated by broken line arrows in FIG. 1.

That is, even if the angle and receiving condition of the antenna are identical for all the channels, a large error may be produced in the received level $L_{CN}$ calculated for certain channels, which results in confusing the user.

OBJECTS AND SUMMARY OF THE PRESENT INVENTION

Accordingly, it is an object of the present invention to provide a BS receiver apparatus which is capable of calculating a precise noise level for each channel to thereby eliminate large differences in the noise level among the respective channels in the same receiving condition.

As an aspect of the present invention a satellite broadcast receiver for detecting a noise level in a predetermined range comprises of a local oscillator for generating a local oscillating signal, a mixer for mixing the local oscillating signal with a received signal, a tuning circuit for controlling the frequency of the local oscillating signal generated by the local oscillator, and a noise level detector.

The above and other objects, features, and advantages of the invention will become be more fully apparent from the ensuing description of a preferred embodiment thereof, when considered in conjunction with the accompanying drawings.

DETAILED DESCRIPTION OF THE PREFERRED EMBODIMENT

Figure 2:
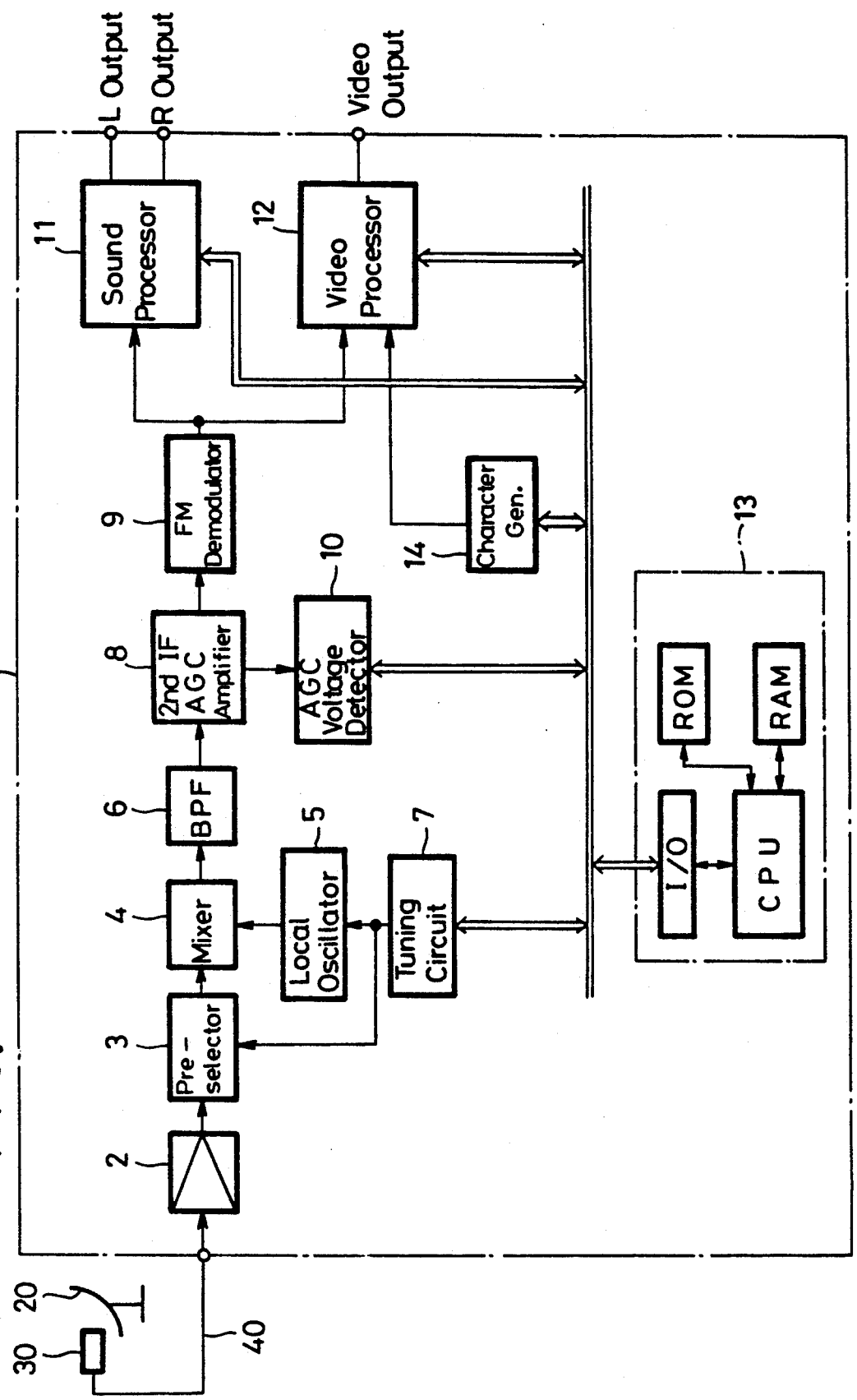
FIG. 2 is a block diagram illustrating an embodiment of a BS tuner according to the present invention.

FIG. 2 is a block diagram illustrating an embodiment of a receiver apparatus according to the present invention or BS tuner 1. A BS antenna 20 receives and supplies a radio wave in a 12 GHz band to a BS converter 30, which in turn converts the supplied radio wave to a first intermediate frequency signal (1.03–1.33 GHz). A received signal converted to the first intermediate frequency signal by the BS converter 30 is supplied to the BS tuner 1 through a coaxial cable 40.

Reference numeral 2 designates a high frequency amplifier circuit, 3 a preselector circuit, 4 a mixer circuit, 5 a local oscillator, 6 a bandpass filter, and 7 a tuning circuit. Based on a tuning voltage generated from the tuning circuit 7 for controlling the oscillating frequency of the local oscillator 5, a desired channel is selected from the received signal supplied as the first intermediate frequency signal. The received signal is further converted to a second intermediate frequency signal at a frequency of 134.26 MHz or 402.78 MHz.

The received signal converted to the second intermediate frequency signal is amplified by an AGC amplifier circuit 8 and FM demodulated by an FM demodulator circuit 9. An AGC control voltage is supplied from the AGC amplifier circuit 8 to an AGC voltage detector circuit 10, whereby a received level can be measured by the AGC voltage detector circuit 10 as a carrier level of the second intermediate frequency signal converted from the received signal.

The FM demodulated signal is supplied to an audio signal processing circuit 11 comprising a four-phase DPSK demodulator circuit and a PCM demodulator circuit to produce L and R audio signals as well as to a video signal processing circuit 12 comprising a deemphasis circuit, an energy diffusion signal removing circuit, a video amplifier circuit and so on to extract a video signal. The L and R audio signals and the video signal are supplied to a TV (television) receiver, which may be integrated with the BS tuner 1 or may be separate therefrom, to be outputted as sounds and an image.

A system controller 13 having a microcomputer comprising a CPU, a ROM, a RAM, and an interface controls a channel selection, an AGC voltage detection and processing of a variety of signals. A character generator 14, under the control of the system controller 13, supplies a character signal to the video signal processing circuit 12 for displaying a predetermined character on the screen of the TV receiver superimposed on a received image.

The BS tuner 1 is comprises the circuit blocks as described above. The system controller 13, on the other hand, is also provided, as function means in the form of software, with a high-band noise level measuring means for controlling received frequency to a frequency corresponding to the channel 16.5 of the BS channel so as to measure an AGC voltage $N_{f(16.5)}$ at that frequency, a low-band noise level measuring means for controlling the received frequency to a frequency corresponding to a channel $-0.5$ of the BS channel so as to measure an AGC voltage $N_{f(-0.5)}$ at that frequency, a received signal level measuring means for controlling so as to measure an AGC voltage $C_{f(x)}$ when an arbitrary channel specified by the user is being received, a calculating means for calculating a noise level at the channel frequency at which the received signal level was measured from the received signal levels respectively measured in the high band and the low band, and then calculating a received level corresponding to C/N of the received channel from the calculated noise level and the measured received level, and a display control means for controlling the character generator 14 to display the value calculated by the calculating means on the screen of the TV receiver.

Figure 3:
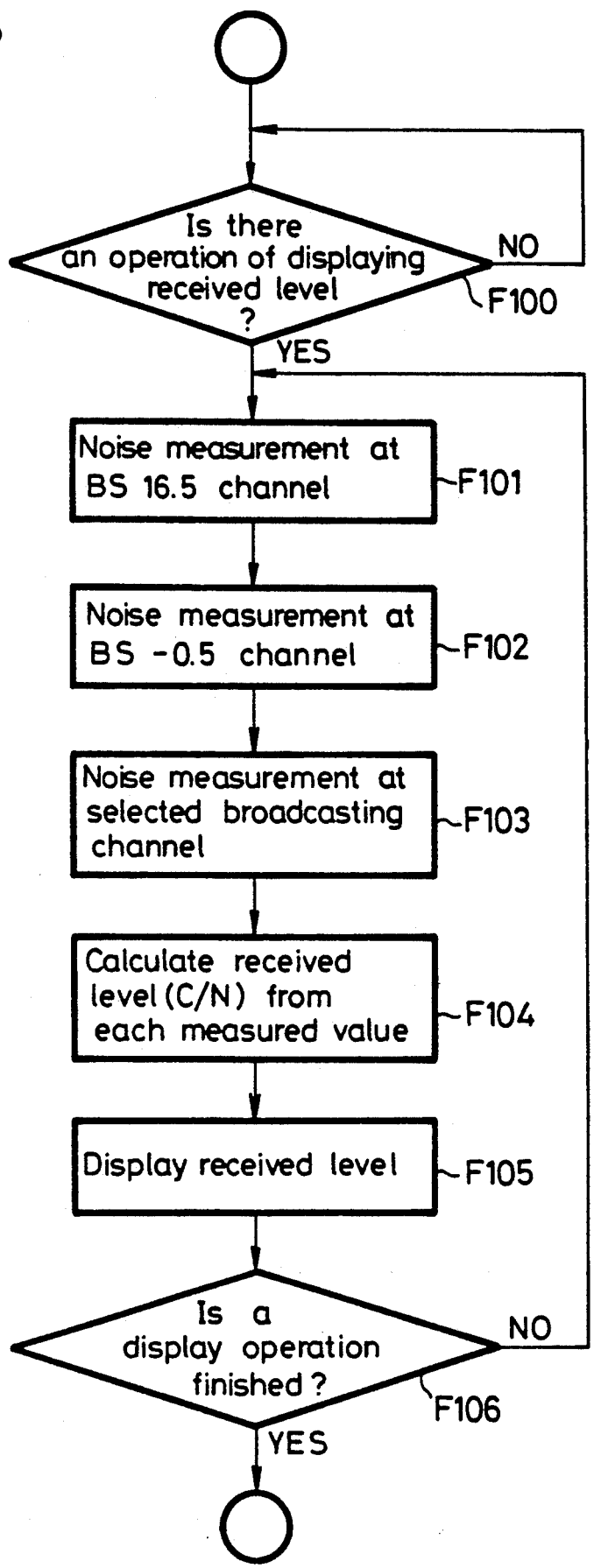
FIG. 3 is a flowchart illustrating the operation of a system controller employed in the embodiment shown in FIG. 2.

By virtue of the system controller 13 having the above-mentioned control means in the form of software, the system controller 13 can measure the received level corresponding to the C/N by performing the operations illustrated in the flowchart of FIG. 3.

Figure 1:
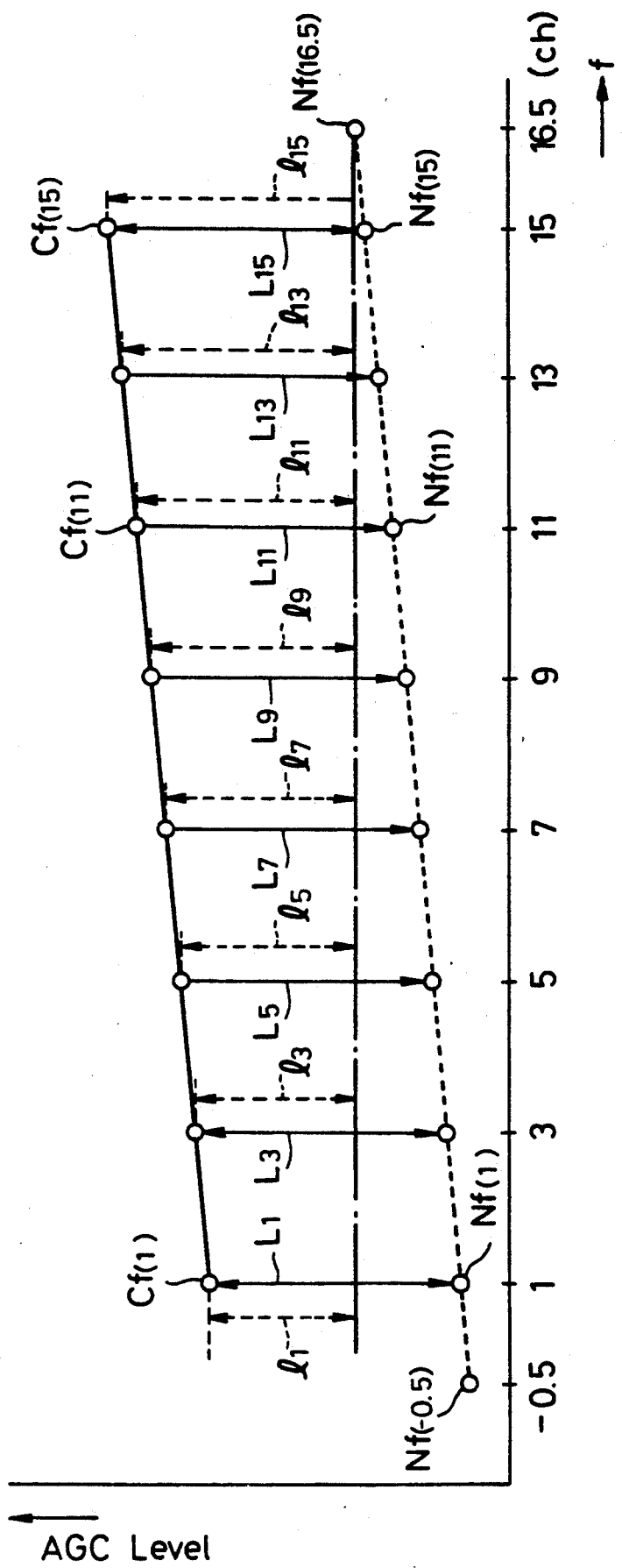
FIG. 1 is a graph used for explaining the difference in a received level corresponding to the C/N which occurs in each receiving channel.

More specifically, when the user operates the receiver apparatus to display a received level on the screen of a TV receiver (step F100), at first the tuning circuit 7 is controlled to receive the channel 16.5, and in this state an AGC voltage value is detected by the AGC voltage detector circuit (step F101). Since the channel 16.5 is not assigned to the satellite broadcast, the detected AGC voltage value can be measured as a noise level $N_{f(16.5)}$ as shown in FIG. 1. Next, an AGC voltage value at the channel $-0.5$ is detected, thereby measuring a noise level $N_{f(0.5)}$ in a band lower than the broadcasting frequency band (step F102).

Then, a predetermined channel, for example, the BS channel 11 is received to detect an AGC voltage $C_{f(11)}$ by the AGC voltage detector circuit 10 as a carrier level of the received signal (step F103). Incidentally, the order of the steps F101 to F103 is interchangeable.

When the respective values $N_{f(16.5)}$, $N_{f(-0.5)}$ and $C_{f(11)}$ have been calculated, a received level $L_{CN}$ corresponding to the C/N is calculated by a program as the calculating means (step F104) in accordance with the following equation (1):

$$L_{CN} = K \times \frac{C_{f(x)}}{N_{f(x)}} \quad (1)$$

where K represents a correction coefficient, $C_{f(x)}$ a carrier level at a received frequency corresponding to a channel x, and $N_{f(x)}$ a noise level at a received frequency corresponding to the channel x.

When the received level $L_{CN}$ is calculated for the BS channel 11, 11 is substituted for x (x=11). The value $C_{f(11)}$ has already been calculated at step F103.

Supposing that $N_{f(x)}$ can be linearly approximated as indicated by a dot line in FIG. 1, the following equation is satisfied:

$$N_{f(x)} = N_{f(-0.5)} + \frac{N_{f(16.5)} - N_{f(-0.5)}}{f_{(16.5)} - f_{(-0.5)}} \times (f_{(x)} - f_{(-0.5)}) \quad (2)$$

where $f_{(x)}$ designates the frequency corresponding to the channel x, and $f_{(16.5)}$, $f_{(-0.5)}$ frequencies corresponding to the channels 16.5, $-0.5$, respectively.

Since the values $N_{f(16.5)}$ and $N_{f(-0.5)}$ have been measured at steps F101, F102, the noise level $N_{f(11)}$ corresponding to the BS channel 11 is calculated by substituting $f_{(11)}$ for the $f_{(x)}$ in the equation (2). When the noise level $N_{f(11)}$ corresponding to the BS channel 11 thus derived is substituted for $N_{f(11)}$ in the equation (1), the received level $L_{CN}$ corresponding to the C/N is calculated.

The received level $L_{CN}$ thus calculated corresponds to a value indicated by a solid line arrow L of each channel (L1–L15). In other words, it is possible to calculate correct received levels for the respective channels without remarkable difference due to the frequency characteristics of the channels.

When the received level $L_{CN}$ corresponding to the C/N is calculated at step F104 the character generator 14 is controlled on the basis of a program as the display control means to display the received level $L_{CN}$ on the screen of a TV receiver in a predetermined format, e.g., a numerical or bar display (step F105).

The above operations are repeated until the termination of the display of the received level $L_{CN}$ is instructed by the user (step F106), whereby a setting direction of a BS antenna, when installed, can be adjusted such that the received level $L_{CN}$ displayed on the screen becomes maximum.

As described above, the receiver apparatus of the present embodiment can calculate a noise level corresponding to each channel from the measured values $N_{f(16.5)}$ and $N_{f(-0.5)}$ in a linear approximation fashion, so that a received level can be displayed without differences among the respective channels, whereby the user will not be confused. In addition, since the received level measuring unit is composed of a system based on the AGC voltage detection and software for calculating the received level $L_{CN}$, it can be manufactured at a remarkably low cost.

It goes without saying that receivers to which the present invention can be applied are not limited to BS tuners.

The receiver apparatus of the present invention as described above derives a received signal level of an arbitrary channel from an AGC voltage and calculates a noise level of the channel from noise levels measured in a high band and a low band in a linear approximation fashion to calculate a received level corresponding to the C/N, thereby eliminating differences in received levels among the respective channels and displaying a received level which is readily understood by the user.

While a single preferred embodiment of this invention has been described in detail hereinabove, many modifications and variations can be made by those skilled in the art without departing from the scope or spirit of the present invention, which is to be defined by the appended claims.

What is claimed is:

1. A satellite broadcast receiver for detecting a noise level of a received signal in a predetermined broadcast band, said satellite broadcast receiver comprising:

antenna means enabling reception of satellite broadcast signals;

a local oscillator for generating a local oscillating signal;

a mixer for mixing said local oscillating signal with a signal received by said antenna means;

a tuning circuit for controlling the frequency of said local oscillating signal generated by said local oscillator, thereby selecting a desired channel in said predetermined broadcast band from said received signal;

control means for causing said tuning circuit to control the frequency of said local oscillator to a first frequency higher than said predetermined broadcast band and to a second frequency lower than said predetermined broadcast band; and a noise level detector for detecting a first noise level of a received signal at said first frequency and a second noise level of a received signal at said second frequency, and including means for calculating a noise level at said desired channel using said first and second frequencies, said first and second noise levels, and a frequency of said desired channel.

2. A radio wave receiver for detecting a noise level of a received signal in a predetermined broadcast band, said radio wave receiver comprising:

a local oscillator for generating a local oscillating signal;

a mixer for mixing said local oscillating signal with a received signal;

a tuning circuit for controlling the frequency of said local oscillating signal generated by said local oscillator, thereby selecting a desired channel in said predetermined broadcast band from said received signal;

control means for causing said tuning circuit to control the frequency of said local oscillator to a first frequency higher than said predetermined broadcast band and to a second frequency lower than said predetermined broadcast band; and a noise level detector for detecting a first noise level of a received signal at said first frequency and a second noise level at said second frequency, and including means for calculating a noise level at said desired channel using said first and second frequencies, said first and second noise levels, and a frequency of said desired channel.

3. A radio wave receiver according to claim 2 wherein said noise level detector comprises an AGC voltage detector.

4. A satellite broadcast receiver according to claim 1 wherein said noise level detector comprises an AGC voltage detector.

5. A satellite broadcast receiver according to claim 4 further comprising a video processor for superimposing information relating to a signal level of the received signal on a received image.

* * * * *